United States Patent
Lee et al.

(10) Patent No.: US 10,340,220 B2
(45) Date of Patent: Jul. 2, 2019

(54) COMPOUND LATERAL RESISTOR STRUCTURES FOR INTEGRATED CIRCUITRY

(71) Applicant: Intel Corporation, Santa Clara, CA (US)

(72) Inventors: Chen-Guan Lee, Portland, OR (US); Vadym Kapinus, Hillsboro, OR (US); Pei-Chi Liu, Portland, OR (US); Joodong Park, Portland, OR (US); Walid M. Hafez, Portland, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/748,608

(22) PCT Filed: Aug. 26, 2015

(86) PCT No.: PCT/US2015/046858
§ 371 (c)(1),
(2) Date: Jan. 29, 2018

(87) PCT Pub. No.: WO2017/034555
PCT Pub. Date: Mar. 2, 2017

(65) Prior Publication Data
US 2019/0006279 A1  Jan. 3, 2019

(51) Int. Cl.
*H01L 23/522* (2006.01)
*H01L 27/06* (2006.01)
(Continued)

(52) U.S. Cl.
CPC .......... *H01L 23/5228* (2013.01); *H01L 21/86* (2013.01); *H01L 27/0629* (2013.01);
(Continued)

(58) Field of Classification Search
CPC . H01L 27/0629; H01L 28/20; H01L 23/5228; H01L 28/24; H01L 29/78657;
(Continued)

(56) References Cited

U.S. PATENT DOCUMENTS 5,663,570 A    9/1997   Reedy et al.
8,252,657 B2   8/2012   Tseng et al.
(Continued)

FOREIGN PATENT DOCUMENTS

JP     2009099755     5/2009

OTHER PUBLICATIONS

International Preliminary Report on Patentability from PCT/US2015/046858 notified Mar. 8, 2018, 6 pgs.
(Continued)

*Primary Examiner* — Caleen O Sullivan
(74) *Attorney, Agent, or Firm* — Green, Howard & Mughal LLP

(57) ABSTRACT

IC device structures including a lateral compound resistor disposed over a surface of a substrate, and fabrication techniques to form such a resistor in conjunction with fabrication of a transistor. Rather than being stacked vertically, a compound resistive trace may include a plurality of resistive materials arranged laterally over a substrate. Along a resistive trace length, a first resistive material is in contact with a sidewall of a second resistive material. A portion of a first resistive material along a centerline of the resistive trace may be replaced with a second resistive material so that the second resistive material is embedded within the first resistive material.

20 Claims, 14 Drawing Sheets

(51) Int. Cl.
    *H01L 49/02*     (2006.01)
    *H01L 29/78*     (2006.01)
    *H01L 21/86*     (2006.01)
    *H01L 29/786*    (2006.01)

(52) U.S. Cl.
    CPC .............. *H01L 28/00* (2013.01); *H01L 28/22* (2013.01); *H01L 29/785* (2013.01); *H01L 29/78657* (2013.01); *H01L 28/24* (2013.01)

(58) Field of Classification Search
    CPC ........... H01L 27/0802; H01L 29/66795; H01L 21/84; H01L 28/22; H01L 21/86; H01L 28/00; H01L 29/785; G11C 11/412
    USPC .......................................... 365/154; 257/536
    See application file for complete search history.

(56) References Cited

U.S. PATENT DOCUMENTS

| | | |
|---|---|---|
| 2001/0030885 A1 | 10/2001 | Maimon et al. |
| 2014/0084381 A1 | 3/2014 | Yeh et al. |

OTHER PUBLICATIONS

International Search Report and Written Opinion from PCT/US2015/046858 notified Feb. 23, 2016, 9 pgs.

COMPOUND LATERAL RESISTOR STRUCTURES FOR INTEGRATED CIRCUITRY

CLAIM OF PRIORITY

This Application is a National Stage Entry of, and claims priority to, PCT Application No. PCT/US2015/046858, filed on 26 Aug. 2015 and titled "COMPOUND LATERAL RESISTOR STRUCTURES FOR INTEGRATED CIRCUITRY", which is incorporated by reference in its entirety for all purposes.

BACKGROUND

Monolithic integrated circuits (ICs) generally comprise a number of passive devices, such as resistors, and/or active devices, such as metal-oxide-semiconductor field-effect transistors (MOSFETs), or the like, fabricated over a substrate. FIG. 1A is a plan view of a conventional monolithic compound resistor 110 disposed over a substrate isolation dielectric 106. FIG. 1B is a cross-sectional view of conventional compound resistor 110 that consists of two resistive materials, 115 and 120, stacked vertically. Resistor contacts 130 are made at two ends of compound resistor 110 and interconnected with other passive and active devices into an IC. Through selection of materials 115 and 120, and a ratio of their z-thicknesses, compound resistor 110 may have a wide range of resistivity and thermal properties.

However, the multiple resistive materials employed in conventional compound resistor introduce problems not found in homogenous thin film resistor designs. For example, the multiple resistive materials often have very different thermal properties and when the compound resistor experiences Joule heating during operation, thermal expansion mismatch can be an issue. Delamination of the resistor material(s) and/or mechanical stress-induced voiding/cracking within the materials may result in an uncontrolled change of resistance value and/or an open circuit condition. Another concern with a conventional compound resistor is the potential for reaction with surrounding interlayer dielectric (ILD). Chemical reactions and/or solid-state diffusion with the ILD material may occur along the entire resistive length of the multiple resistive materials exposed to the ILD.

Compound resistor structures that are less susceptible to these failure modes would therefore be advantageous in advanced IC structures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
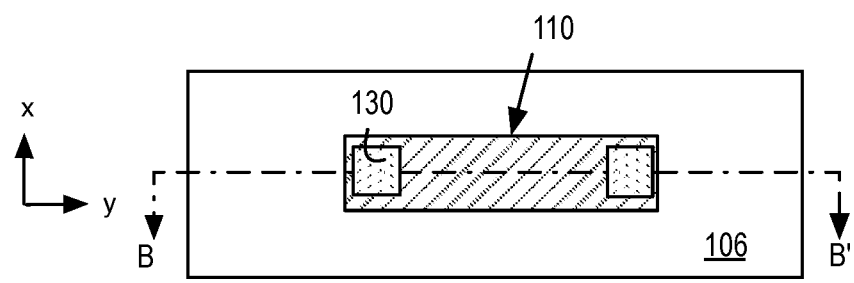
FIG. 1A is a plan view of a conventional compound resistor.
Figure 1B:
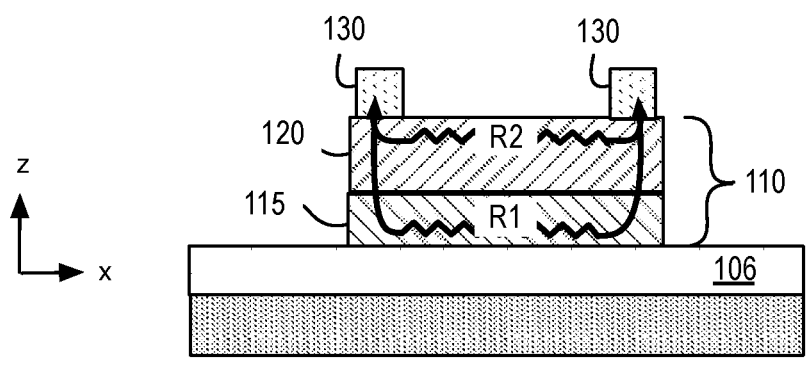
FIG. 1B is a cross-sectional view of the conventional planar resistor illustrated in FIG. 1A.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

IC structures including a lateral compound resistor disposed over a surface of a substrate, and fabrication techniques to form such a resistor in conjunction with fabrication of a transistor, are described herein. In some embodiments, rather than being stacked vertically, a compound resistive trace includes a plurality of resistive materials arranged laterally over a substrate. Hence, along a resistive trace length, a first resistive material is in contact with a sidewall of a second resistive material. In some exemplary embodiments, a portion of a first resistive material along a longitudinal centerline of the resistive trace is replaced with a second resistive material, embedding the second resistive material within the first resistive material. Where the second resistive material has lower resistivity than the first, resistor current will be predominantly in the center of the resistor device. Material expansion mismatch within the resistive trace may be advantageously oriented laterally, rather than vertically. Also, lateral compound resistor materials arranged in accordance with embodiments herein may be less exposed to surrounding interconnect ILD layers than they are in conventional structures. Oxidization and/or other unintentional changes in resistor material properties may be therefore advantageously reduced or avoided. In some further embodiments, compound lateral resistor fabrication is integrated with replacement gate transistor (finFET or planar) processes by concurrently forming the first resistive material and sacrificial gate out of a same material, such as polysilicon. By differentiating the sacrificial gate mask material and/or profile from the resistor mask material and/or profile, the gate replacement process may be leveraged to replace only a central portion of the first resistive material with a second resistive material.

Figure 2:
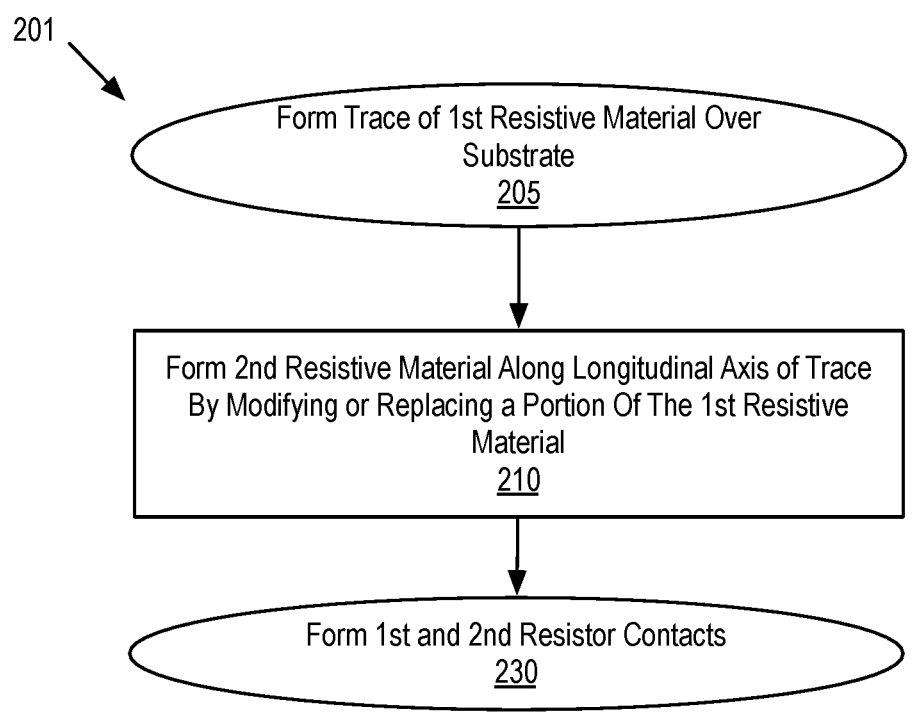
FIG. 2 is a flow diagram illustrating a method of forming a lateral compound resistor, in accordance with some embodiments.

FIG. 2 is a flow diagram illustrating a method 201 for forming a lateral compound resistor, in accordance with some embodiments. Method 201 begins at operation 205 where a trace of a first resistive material is formed over a substrate. At operation 210, a portion of the first resistive material is replaced or modified along a longitudinal centerline of the trace to form the second resistive material. The lateral compound resistor is then completed at operation 230 by forming a first and second resistor contact, which may be electrically interconnected with other passive and/or active components of an IC formed in other regions of the substrate.

Figure 3A:
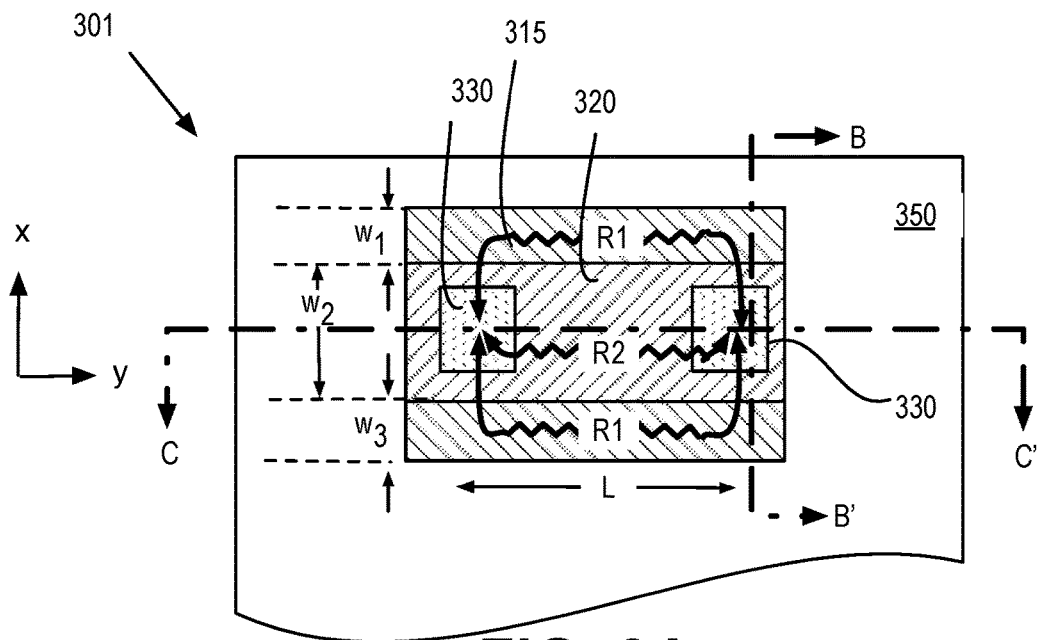
FIG. 3A is a plan view of a lateral compound resistor, in accordance with some embodiments.
Figure 3B:
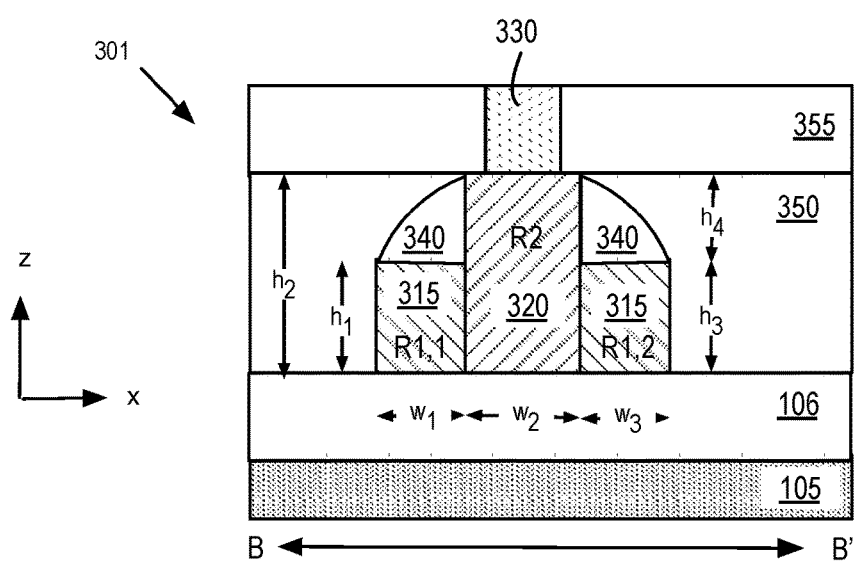
FIGS. 3B and 3C are cross-sectional views of the lateral compound resistor illustrated in FIG. 3A, in accordance with some embodiments.
Figure 3C:
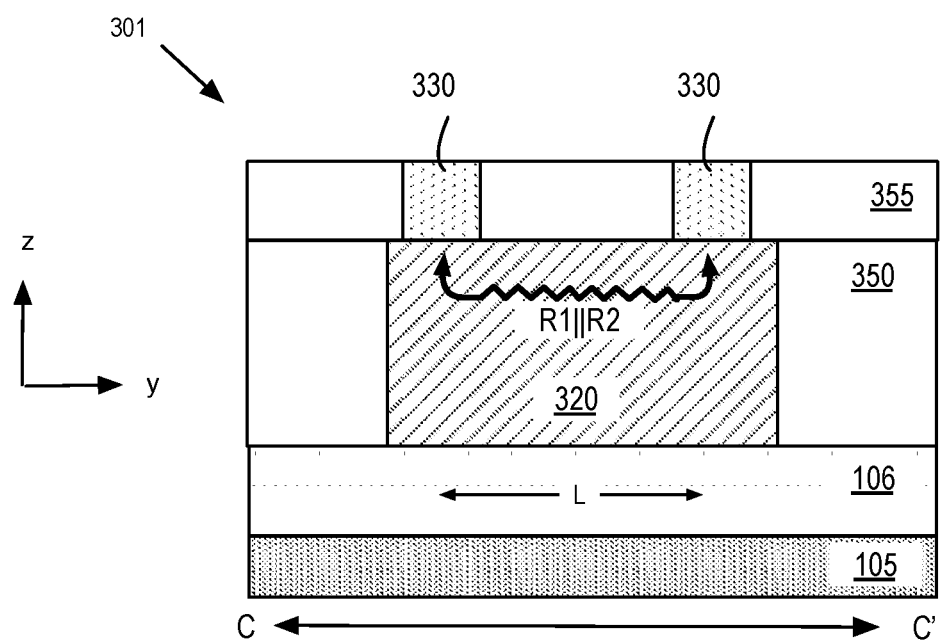

FIG. 3A is a plan view of a lateral compound resistor 301 that may be fabricated following method 201, in accordance with some embodiments. FIG. 3B is a cross-sectional view of lateral compound resistor 301 along the B-B' plane illustrated in FIG. 3A, in accordance with some embodiments. FIG. 3C is a cross-sectional view of lateral compound resistor 301 along the C-C' plane illustrated in FIG. 3A, in accordance with some embodiments.

As shown in FIG. 3A-3C, compound lateral resistor 301 includes a trace comprising both a first resistive material 315 laterally surrounding a second resistive material 320, both of which are disposed over a substrate 105. In some embodiments as illustrated, resistive material 320 is disposed on a surface of substrate isolation dielectric 106. In other embodiments, resistive material 320 may be embedded within resistive material 315 and not in contact with material layers disposed below resistive material 315. In some exemplary embodiments where substrate 105 has insufficient resistivity, substrate isolation dielectric material 106 is disposed between substrate 105 and at least the first resistive material 315. Resistor 301 may be alternatively deposited directly on substrate 105, or a substrate may be defined so as to include isolation dielectric 106 (e.g., semiconductor-on-insulator substrate). In addition to lateral compound resistor 301, one or more active devices (not depicted), such as transistors (e.g., metal-oxide-semiconductor field effect transistors), photodetectors (e.g., P-i-N photodiodes), lasers, modulators, and the like may be similarly disposed in, on, or over substrate 105. In addition to lateral compound resistor 301, one or more other passive device, such as capacitors, inductors, optical waveguides, and the like may also be disposed in, on, or over substrate 105.

Substrate 105 may be any substrate suitable for forming a monolithically integrated electrical, optical, or microelectromechanical (MEM) device, generally referred to herein as an IC. Exemplary substrates include a semiconductor substrate, semiconductor-on-insulator (SOI) substrate, an insulator substrate (e.g., sapphire), or the like, and/or combinations thereof. In one exemplary embodiment, substrate 105 comprises a substantially monocrystalline semiconductor, such as, but not limited to, silicon. Exemplary semiconductor substrate compositions also include germanium, or group IV alloy systems, such as SiGe; group III-V systems, such as GaAs, InP, InGaAs, and the like; or group III-N systems, such as GaN.

Substrate isolation dielectric 106 may be any dielectric material known in the art to be suitable for electrically isolating resistor 301 from substrate 105. Exemplary materials include, but are not limited to, silicon oxides (SiO), silicon nitrides (SiN), silicon oxynitrides (SiON), silicon carbonitrides (SiCN), and low-k materials (e.g., carbon doped silicon dioxide (SiOC), porous dielectrics, etc.).

Resistive materials 315, 320 may form a resistive line, or pad, etc. over a region of substrate 105. Resistive materials 315, 320 may each be of any material having a suitable resistivity for providing a conduction path of predetermined parallel resistance (R1∥R2) between a pair of resistor contacts 330 spaced apart by lateral length L. In some embodiments, both resistive materials 315, 320 have a sheet resistance greater than that of the material employed for conductive vias and/or traces coupled to resistor contacts 330. In some exemplary embodiments, resistive material 320 has lower resistivity than resistive material 315. In some embodiments, at least one of resistive materials 315, 320 is a doped or undoped semiconductor and/or a metallic compound. Exemplary semiconductors include silicon, germanium, and silicon germanium. While the semiconductor material may be monocrystalline or amorphous, in some embodiments the semiconductor is polycrystalline. Doping of resistive materials 315, 320 may depend upon the semiconductor material system utilized and may render each material n-type or p-type. In one exemplary embodiment where at least one of resistive materials 315, 320 is polysilicon, the impurity is p-type (e.g., Boron). Impurity dopant level is a function of the desired sheet resistance, and may be, for example, less than $10^{17}/cm^3$. In other embodiments where at least one of resistive materials 315, 320 is a metallic compound, any metal or metal alloy known to be suitable for thin film resistor applications may be utilized, such as, but not limited to, tantalum, tungsten, aluminum, nickel, titanium, cobalt, their alloys, and nitrides, silicides and carbides thereof.

In some exemplary embodiments where resistive material 315 is a first semiconductor material, resistive material 320 is the same first semiconductor material but doped to a different (e.g., higher) impurity concentration than resistive material 315. In some exemplary embodiments where resistive material 315 is a first semiconductor material, resistive material 320 is a second, different, semiconductor material. For example, in some embodiments where resistive material 315 is polycrystalline silicon, resistive material 320 is a semiconductor other than polycrystalline silicon, such as polycrystalline Ge, or polycrystalline SiGe. In some exemplary embodiments where resistive material 315 is a first semiconductor material, resistive material 320 is a metallic compound. In some exemplary embodiments where resistive material 320 is a first semiconductor material, resistive material 315 is a metallic compound.

As shown in FIG. 3B, because resistive material 315 is disposed adjacent to opposite sidewalls of resistive material 320, resistor 301 may also be considered three resistors in parallel (R1,1∥R2∥R1,2) extending over the resistive trace length L. A cross-section of the resistive line orthogonal to current flow comprises a sectional area of resistive material 320, and two sectional areas of resistive material 315. Electrical resistance contribution R2 is therefore a function of lateral width $w_2$ and z-height $h_2$. Electrical resistance contribution R1 is a function of $w_1$ and z-height $h_1$(R1,1), and $w_3$ and z-height $h_3$ (R1,2), which reduces to $2w_1$ and $h_1$ for exemplary embodiments where $w_1=w_3$ and $h_1=h_3$. Resistor 301 has lateral dimensions of approximately L*(2$w_1$+$w_2$), which define the lateral footprint (i.e., substrate area). As illustrated in FIG. 3C, resistive material 315 is absent from sidewalls of resistive material 320 along ends of the longitudinal length (e.g., y-axis). Length L is advantageously minimized to reduce the resistor footprint. In an exemplary embodiment, length L is sized to just accommodate two resistor contacts 330 of minimum contact dimension, and minimum pitch according to the design rule for the given material layer. As contact dimensions and contact pitch scale with technology, these values can be expected to change over time with an exemplary range being 10-30 nm. Width $w_1$ and $w_2$ advantageously minimized to reduce footprint. In an exemplary embodiment, width $w_2$ is sized to just accommodate contacts 330 of minimum contact dimension, or slightly larger, to accommodate misregistration, etc. As described further below, width $2w_1+w_2$ may be some target lithographically printed dimension that is split into separate materials by non-lithographic means.

As shown in FIGS. 3B and 3C, resistive material 320 has a z-height $h_2$, which may be only partially dependent on the height $h_1$ and/or $h_3$ associated with resistive material 315. As described further below, z-heights $h_1$ and/or $h_3$ may be determined as a function of a deposited film thickness. For example, where resistive material 315 is polysilicon, $h_1$ and/or $h_3$ may vary between a 10 and 500 nm deposited polysilicon film thickness. The z-height $h_2$ may be further determined as a function of additional parameters, for example as a function of a deposited film thickness, a planarization with surrounding materials, and/or an extent of selective recess etching. In the illustrative embodiment, wherein resistive material is planarized with a surrounding ILD 350, $h_2$ is equal to a sum of the z-height $h_1$ and a z-height $h_4$ associated with a hardmask material 340 disposed over resistive material 315. As such, a top surface of resistive material 320 is substantially planar with a top surface of hardmask material 340 and ILD 350. The ILD 350 and hardmask material 340 may each be any material known to be suitable for their function, such as, but not limited to, SiO, silicon nitrides (SiN), silicon oxynitrides (SiON), silicon carbonitrides (SiCN), and low-k materials (e.g., carbon doped silicon dioxide (SiOC), porous dielectrics, etc.). In some exemplary embodiments, hardmask material 340 has a composition distinct from that of ILD 350. For example, in one embodiment where ILD 350 is a low-k dielectric (e.g., SiOC), hardmask material 340 is a material of a higher relative dielectric constant (e.g., SiO, SiON, SiN, SiCN, etc.).

As illustrated in FIG. 3A-3C, resistive material 150 is disposed on opposite sides of resistive material 320 along the transverse length (e.g., x-axis). Hardmask material 340, stacked on top of resistive material 315, likewise forms sidewalls adjacent to resistive material 320. In the exemplary embodiment illustrated in FIGS. 3B and 3C, hardmask material 340 is in direct contact with a sidewall portion of resistive material 320. In other embodiments however, for example where resistive material 320 has a smaller z-height $h_2$, hardmask material 340 may form a ridge on either side of a recess in which resistive material 320 is disposed. It is noted that the presence of hardmask material 340 disposed over a top surface of resistive material 315, in conjunction with the absence of hardmask material 340 over a top surface of resistive material 320, is indicative of the technique employed to fabricate resistor 301, as further described below.

Resistor contacts 330 may be coupled to one or more of resistive materials 315 and 320 either directly (i.e., in direct contact with) or indirectly (i.e., through one or more intervening material). In the exemplary embodiment where resistive material 320 has a greater z-height ($h_2 > h_1$), resistor contacts 330 are in direct contact with resistive material 320 while resistive material 315 is indirectly coupled to contacts 330 only through resistive material 320. Resistor contacts 330 may be any known material(s) advantageously providing ohmic contact to resistive material 320. Resistor contacts 330 may be of any metallization (metal or metal alloy) known to be suitable for transistor contacts. A second ILD 355 is further disposed over compound resistor 301, for example covering a top surface of resistive material 320. Second ILD 355 may be of a same or different composition than ILD 350, such as, but not limited to, SiO, SiN, SiO, SiC), and low-k materials (e.g., SiOC, porous dielectrics, etc.).

Figure 4A:
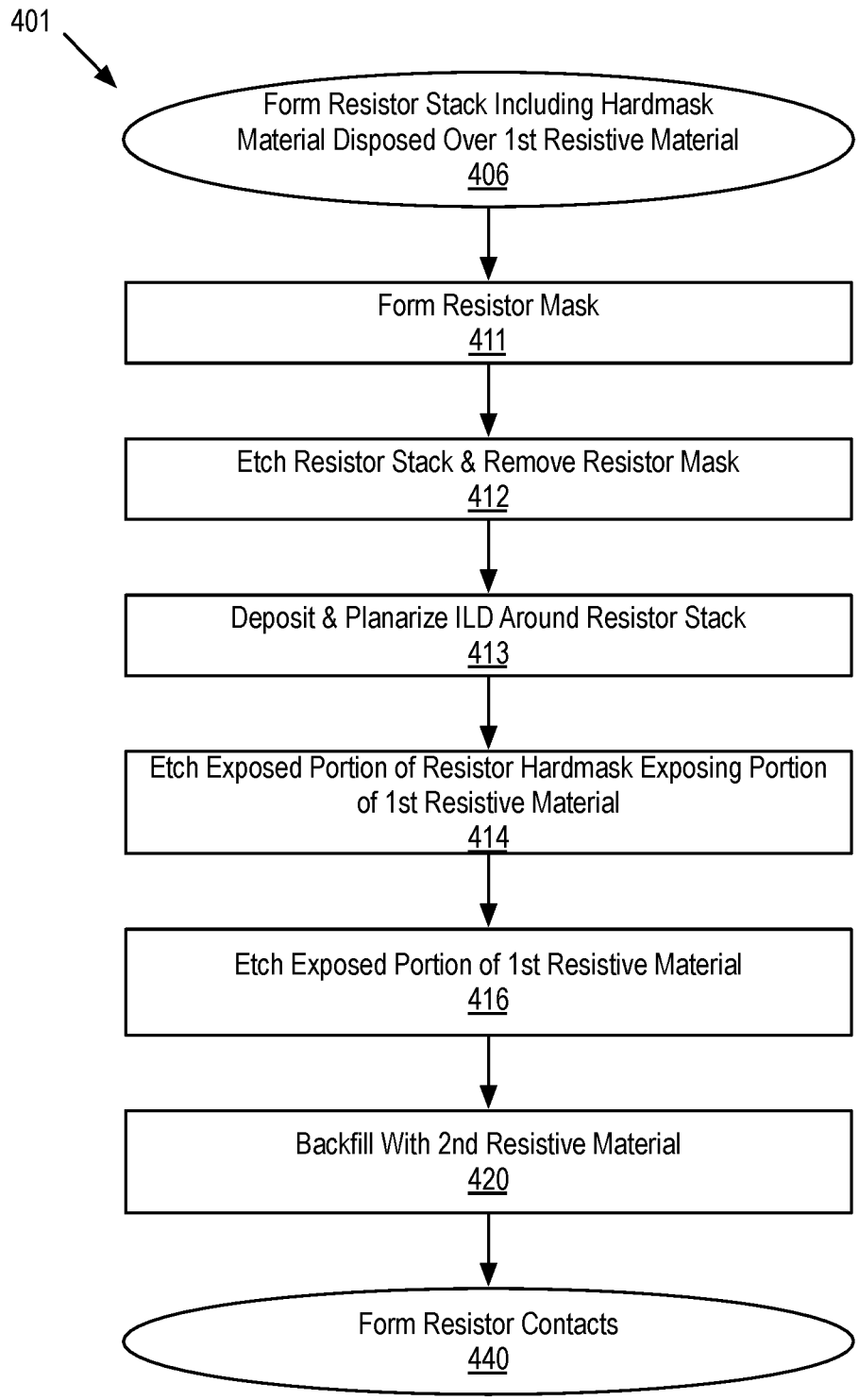
FIG. 4A is a flow diagram illustrating a method of forming a lateral compound resistor, in accordance with some embodiments.

FIG. 4A is a flow diagram illustrating a method 401 for forming a lateral compound resistor, in accordance with some embodiments. Method 401 illustrates one exemplary technique for performing method 201 (FIG. 2), introduced above to arrive at the compound lateral resistor structure illustrated in FIG. 3A-3C.

Method 401 begins at operation 406 where a resistor stack is formed over a region of a substrate. In the exemplary embodiment, the resistor stack includes at least a hardmask material disposed over a first resistive material. The first resistive material may be deposited to a predetermined film thickness suitable for a desired resistance value. Any deposition processes, such as, but not limited to, a chemical vapor deposition (CVD), plasma enhanced CVD (PECVD), physical vapor deposition (PVD), atomic layer deposition (ALD), or the like may be utilized to deposit the first resistive material. In some embodiments, polycrystalline silicon is deposited by CVD to a thickness of 20-500 nm.

At operation 411, a resistor mask is patterned over the resistor stack. In some embodiments where the resistor mask is not photodefinable, operation 411 entails a masked etch of the resistor mask. The resistor mask may be of any suitable material, such as, but not limited to, a carbon based material (e.g., amorphous or diamond-like carbon). In some advantageous embodiments, the composition of the resistor mask is selected based on the composition of the resistor hardmask material so that a subsequent dry etch process has a low etch selectivity (e.g., 1:1) between the resistor mask and resistor hardmask material. In some further embodiments, resistor mask may be physically eroded at operation 411, for example by a physical dry etch process, to round over sidewall corners of the mask features prior to a subsequent etching of the resistor stack.

At operation 412, the resistor stack is etched and the resistor mask removed. An etch process (e.g., dry etch) with low etch selectivity (e.g., 1:1) between the resistor mask and resistor hardmask may be employed at operation 412, ensuring that a significant portion of the resistor mask is consumed during the resistor stack etch operation. In advantageous embodiments, the low etch selectivity and/or a physically intensive etch process (e.g. with a large sputtering component) induces significant resistor mask consumption and/or corner rounding during operation 412. Upon completion of operation 412, unmasked regions of the first resistive material have been cleared and the rounded feature profile of the resistor mask has been translated into the underlying hardmask material. Lines of the first resistive material may then be subsequently etched to define the longitudinal lengths of the resistor stack.

At operation 413, an ILD is deposited and planarized around the patterned resistor stack. Any convention ILD, such as, but not limited to, SiO, SiN, SiON, SiCN, and low-k materials (e.g., SiOC, porous dielectrics, etc.), may be deposited by any known technique. In the exemplary embodiment, a planarization of the ILD has high selectivity to the resistor hard mask such that a top surface of the ILD is planarized with a portion of the resistor hardmask having the greatest film thickness. Because the resistor hardmask has rounded corner profile, ILD will be planarized with only a portion of the resistor hardmask exposed along a longitudinal centerline of the resistor feature.

At operation 414, the exposed portion of the resistor hardmask is removed, for example, with any anisotropic dry etch process known to be suitable for the resistor hardmask material. Upon completion of the hardmask etching operation 414, the first resistive material is exposed within an opening of the hardmask limited to a region along the longitudinal centerline of the resistor feature.

At operation 416, the exposed portion of the first resistive material is recessed, for example with any anisotropic etch process known for the particular resistive material utilized. In some embodiments, the entire film thickness of the first resistive material is etched at operation 416 to expose an underlying surface of the substrate (e.g., a substrate isolation dielectric). In other embodiments, only a partial thickness of the first resistive material is removed.

At operation 420, the recess in the first resistive material is backfilled with a second resistive material, for example with any deposition process known to be suitable. In some embodiments, polycrystalline silicon, Ge, or SiGe, or a metallic compound is deposited by CVD into the recess etched at operation 416. Overburden associated with deposition of the second resistor material is then planarized with the surround ILD and/or remaining resistor hardmask material. In some embodiments, following planarization the backfilled resistive material is recessed below the surrounding ILD and/or resistor hardmask. At operation 440 contacts are formed, for example passing through a second ILD covering the second resistive material, following any conventional techniques. In some embodiments, the resistor contacts are landed on the second resistive material. For some embodiments where the resistive material is recessed below the resistor hardmask, an overlying ILD backfills the recess to be disposed adjacent the resistor hardmask.

Figure 5A:
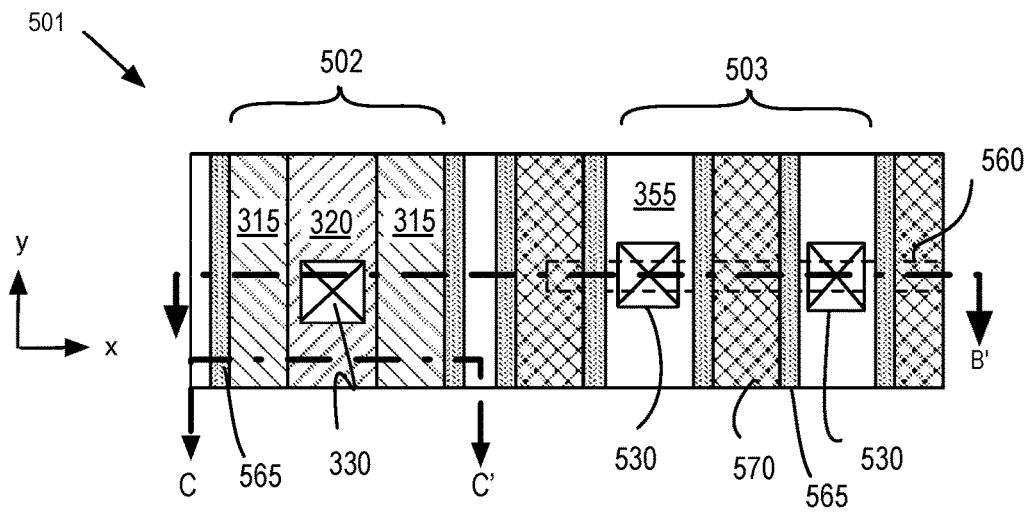
FIG. 5A is a plan view of an IC including a lateral compound resistor and a transistor, in accordance with some embodiments.
Figure 5B:
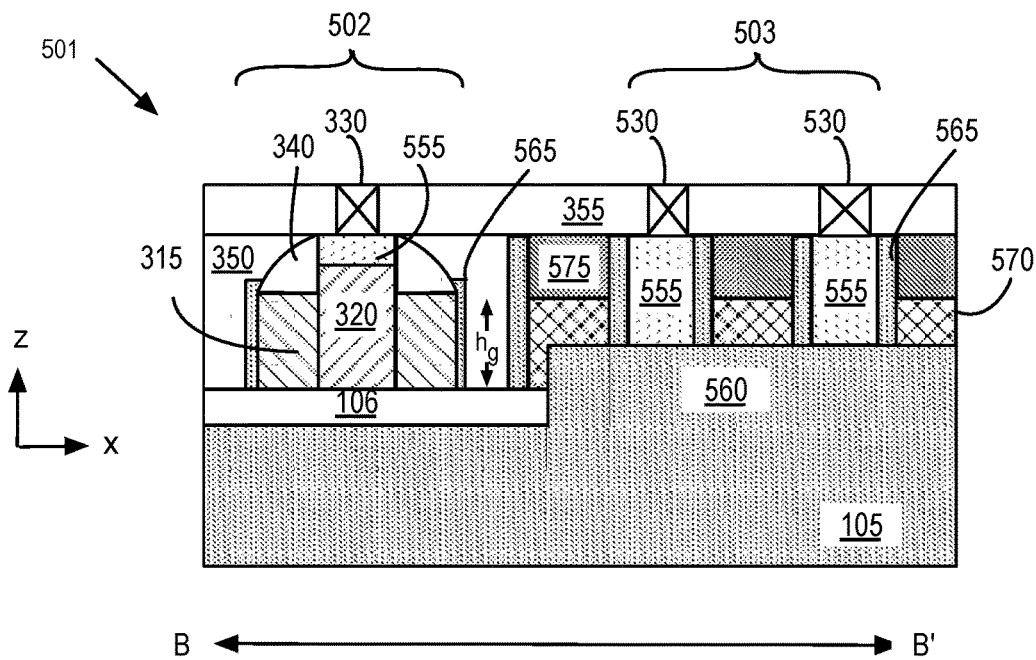
FIG. 5B is a cross-sectional view of an IC including a lateral compound resistor and a transistor, in accordance with some embodiments.
Figure 5C:
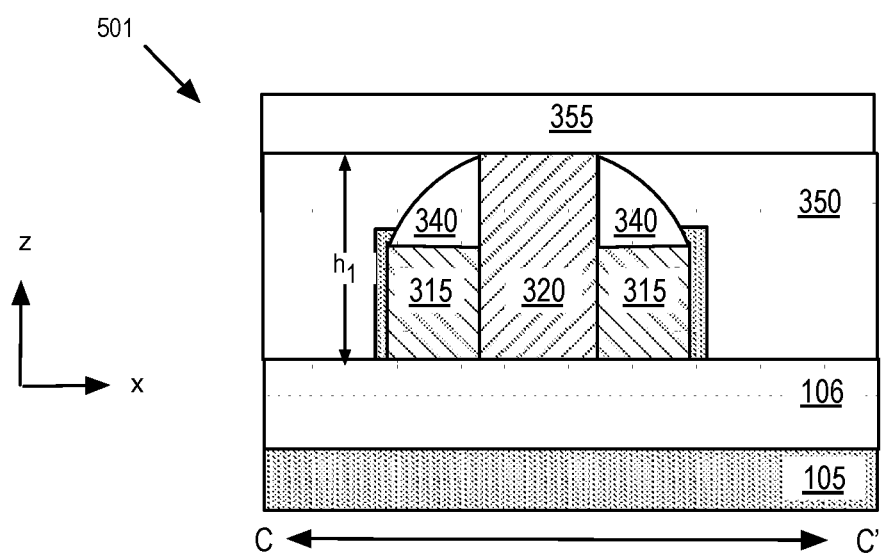
FIG. 5C is a cross-sectional view of the lateral compound resistor illustrated in FIG. 5A, in accordance with some embodiments.

FIG. 5A is a plan view of an IC structure 501 including a lateral compound resistor 502 and a transistor 503, in accordance with some embodiments. FIG. 5B is a cross-sectional view of the IC structure 501 along the B-B' plane illustrated in FIG. 5A, in accordance with some embodiments. FIG. 5C is a cross-sectional view of the IC structure 501 along the C-C' plane illustrated in FIG. 5A, in accordance with some embodiments.

In FIG. 5A, an exemplary non-planar transistor body 560 is delineated in dashed line. Transistor interconnect metallization 530 couples with source/drain regions of semiconductor fin 560 on opposite sides of a gate stack that includes at least a gate electrode 570 disposed over a gate dielectric (not depicted). A dielectric spacer 565 is disposed between source/drain regions and gate electrode 570. Dielectric spacer 565 is further disposed on along an outer sidewall of resistive material 315. In the exemplary embodiment, dielectric spacer 565 is also disposed along at least a lower portion of resistor hardmask material 340. As further illustrated in FIG. 5B, semiconductor fin 560 extends a z-height above substrate isolation dielectric 106. Transistor interconnect metallization 530 lands on a contact metallization 555 disposed between two adjacent dielectric spacers 565. Contact metallization 555 is further disposed on resistive material 320, and resistor interconnect metallization 330 lands on contact metallization 555. In some exemplary embodiments, a top surface of contact metallization 555 is planar with a top surface of ILD 350, and planar with a top surface of resistor hardmask material 340. Resistive material 320 has a z-height (e.g., $h_2$) that is greater than a z-height $h_g$ of gate electrodes 570, as measured from an interface between isolation dielectric 106 and resistive material 320. As further illustrated in FIG. 5C, along a plane beyond contact metallization 555 a top surface of resistive material 320 is planar with the top surface of ILD 350 and planar with the top surface of resistor hardmask material 340.

Figure 6:
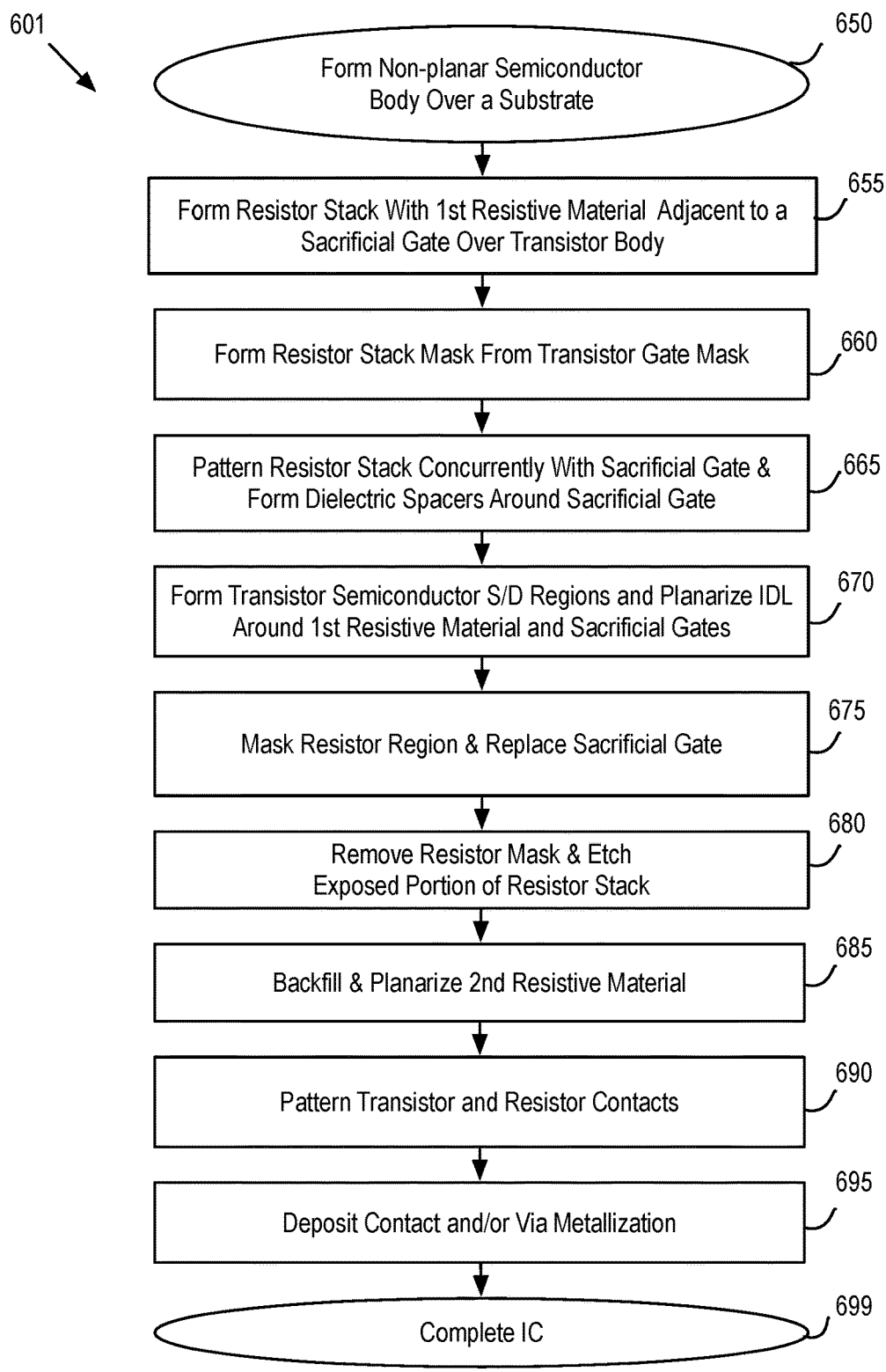
FIG. 6 is a flow diagram illustrating a method of forming an IC including both a lateral compound resistor and a transistor, in accordance with some embodiments.

FIG. 6 is a flow diagram illustrating a method of forming the IC structure 501 illustrated in FIG. 5A-5C, in accordance with some embodiments. FIG. 7A-7H, are cross-sectional views of the IC structure 501 evolving as selected operations in the method depicted in FIG. 6 are performed, in accordance with some further embodiments.

Referring first to FIG. 6, method 601 begins with forming a non-planar semiconductor body over a substrate. Any known fabrication process(es) may be employed at fin formation operation 650. Although exemplary embodiments include a non-planar ("finFET") architecture, it is noted that compound lateral resistor in accordance with embodiments described herein may also be integrated with planar transistor architectures based on the techniques illustrated by FIG. 6 and FIG. 7A-7H.

At operation 655, a single material stack is deposited for use as both a resistor stack and a sacrificial gate stack. Any deposition and planarization techniques known may be employed at operation 655. Method 601 continues with forming both a resistor stack mask and a transistor gate mask at operation 660. In exemplary embodiments, the resistor stack mask is differentiated from the transistor gate mask so that subsequent erosion of the resistor stack mask outpaces that of the transistor gate mask. Stack differentiation may for example entail depositing and patterning different materials for the resistor stack and gate stack masks.

Figure 7A:
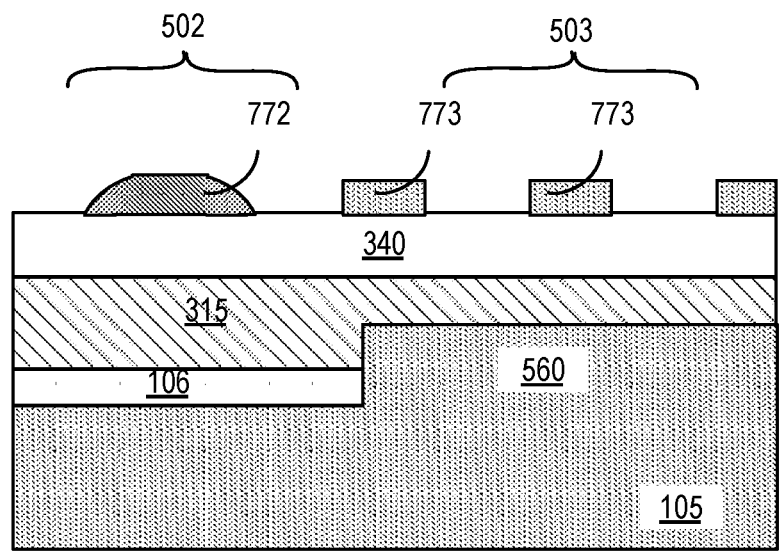
FIGS. 7A, 7B, 7C, 7D, 7E, 7F, 7G, and 7H, are cross-sectional views of an IC including a transistor and a lateral compound resistor evolving as selected operations in the method depicted in FIG. 6 are performed, in accordance with some embodiments.
Figure 7B:
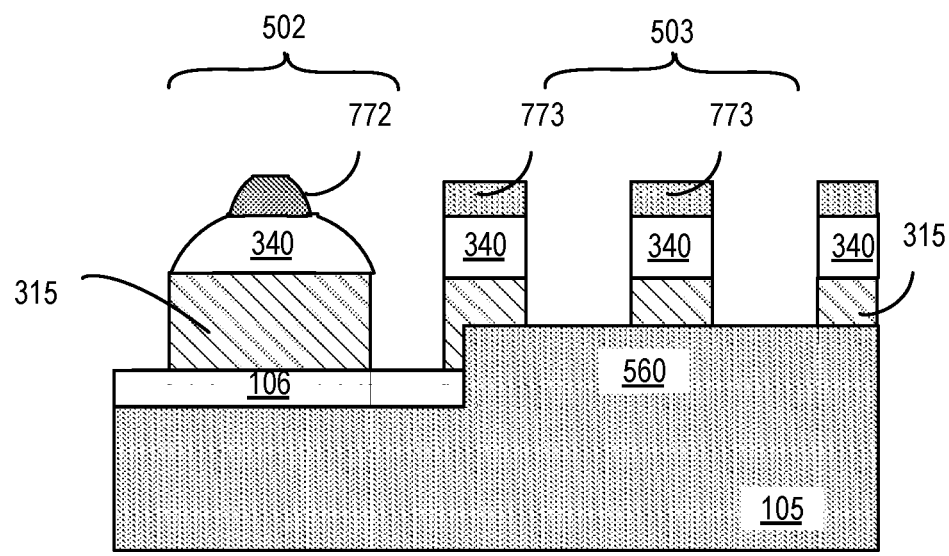

In the structure illustrated in FIG. 7A for example, resistive material 315 is deposited over substrate isolation dielectric 106 and non-planar semiconductor body 560, which extends from substrate 105 to a z-height above substrate isolation dielectric 106. Semiconductor body 560 may be of the same substantially monocrystalline semiconductor as substrate 105 (e.g., silicon). Resistive material 315 is planarized and hardmask material 340 is deposited over resistive material 315 to complete the resistor stack and sacrificial gate electrode stack. A resistor mask 772 (e.g., comprising a carbon-based material such as amorphous carbon) and a sacrificial gate mask 773 (e.g., comprising a dielectric that is not carbon-based) are patterned over the hardmask material 340. In the illustrated example, resistor mask 772 displays more corner rounding than does gate mask 773. Such selective mask profile processing may be performed for example with a controlled ashing process in preparation for the subsequent hardmask material etch.

Figure 7C:
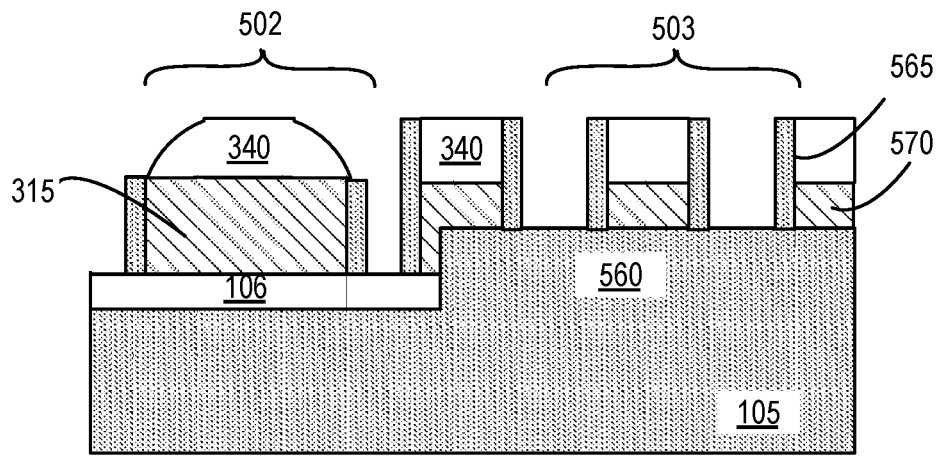
Figure 7D:
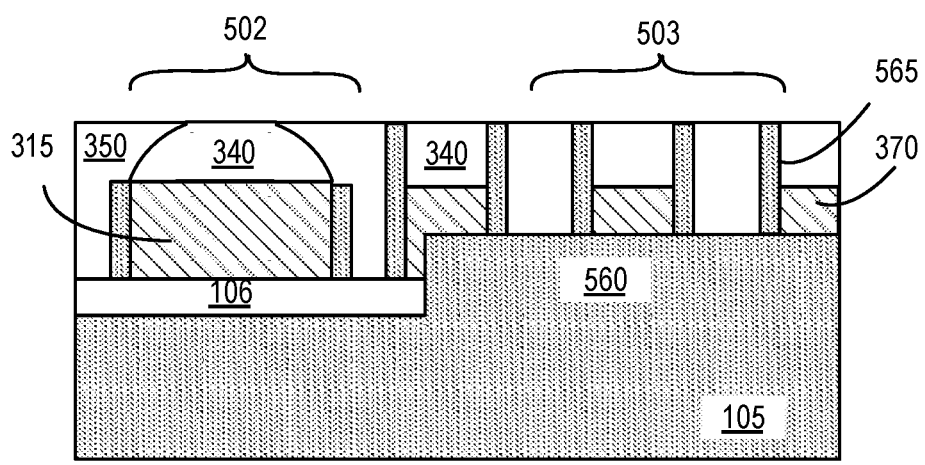
Figure 7E:
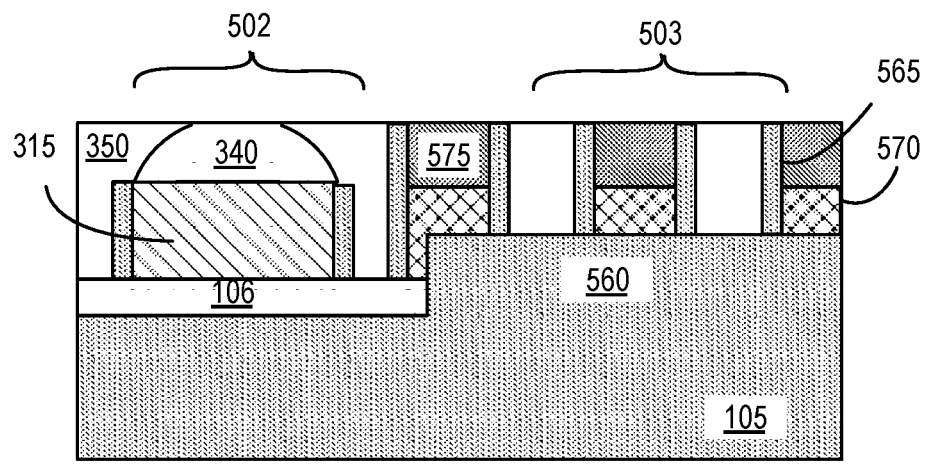
Figure 7F:
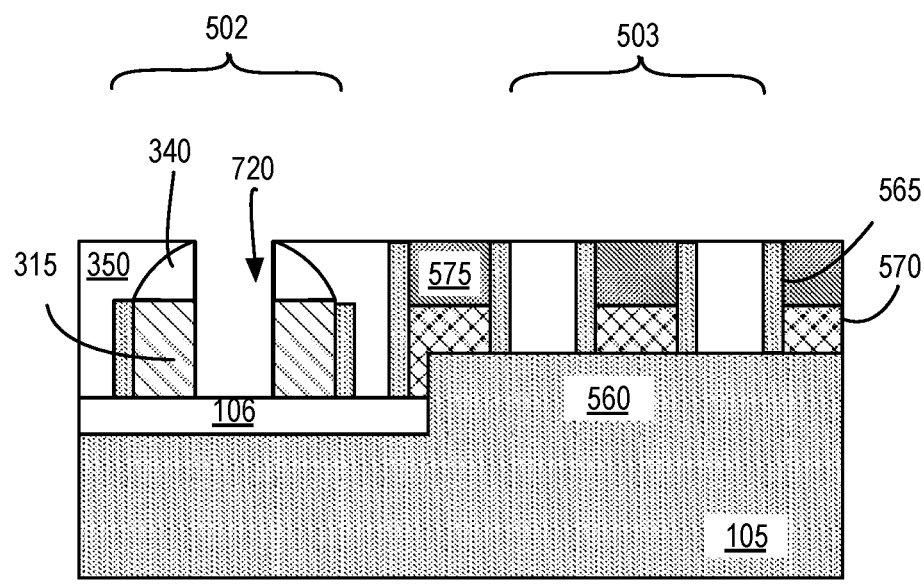
Figure 7G:
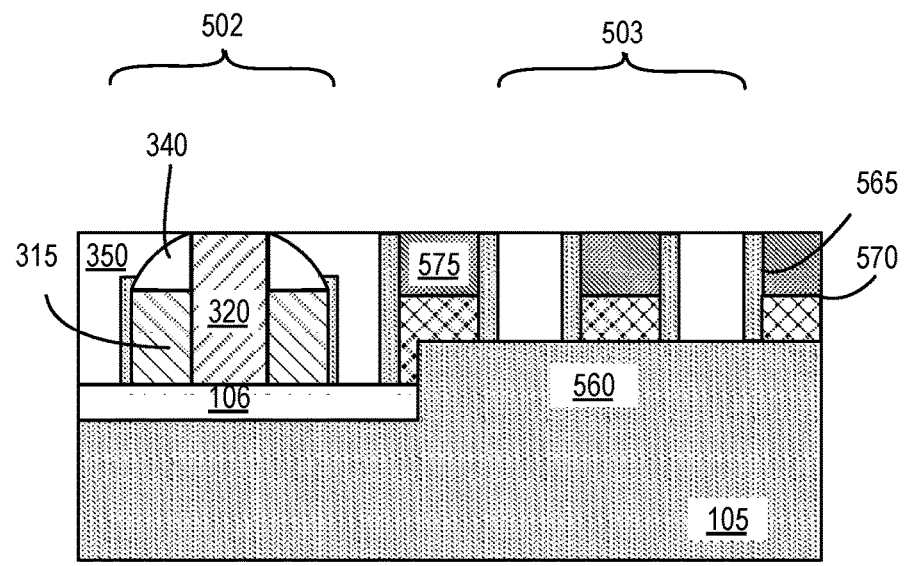

Returning to FIG. 6, method 601 continues with patterning the resistor stack concurrently with the sacrificial gate stack at stack etch operation 665. Any suitable etch process may be employed at operation 665. Following delineation of the resistor and gate electrode stacks, dielectric spacers are formed by any known means (e.g., conformal dielectric film deposition followed by anisotropic etch). In the exemplary embodiment illustrated in FIG. 7B, resistor mask 772 undergoes significant lateral erosion, which advantageously occurs during etch of hardmask material 340. The lateral mask erosion coupled with concurrent etching of hardmask material 340 leads to a radiused profile for the underlying hardmask material 340. In comparison, hardmask material disposed under gate mask 773 is maintained with higher fidelity because of a higher etch selectivity provided by the (non-carbon) material employed for mask 773. Etching of resistive material 315 may have high selectivity to hardmask material 340. A subsequent resistor/sacrificial gate etch may then entail a second patterning process to define the longitudinal length of the resistor stack/sacrificial gate. With the longitudinal resistor length separately defined, no radiusing of hardmask material 340 need occur at the ends of the resistor. FIG. 7C further illustrates exemplary dielectric spacers 565 formed around all significant topography including resistive material 315, sacrificial gate material 570 and hardmask material 340. Dielectric spacers 565 may be formed, for example, after stripping resist and gate masks 772, 773.

Returning to FIG. 6, method 601 proceeds with forming source/drain regions within the semiconductor body and planarization of a first ILD deposited around the patterned resistor stack and sacrificial gate stack. Source/drain regions may be formed through impurity doping and/or epitaxial (re)growth of semiconductor material following any known techniques. ILD material may be spin coated and/or deposited and planarized by any known technique. In the exemplary embodiment illustrated in FIG. 7D, a top surface of ILD 350 is planarized with top surfaces of both the patterned resistor stack and sacrificial gate stack. Following planarization, a lateral width of hardmask material 340 exposed over resistive material 315 is significantly smaller than that of the patterned resistor stack because of the radiused profile of hardmask material 340. For embodiments where the resistor length L is defined separately from the resistor width, lateral length of hardmask material 340 exposed over resistive material 315 is the same as that of the patterned resistor stack because the profile of hardmask material 340 is not radiused in this dimension. In contrast, the surface area (i.e., both length and width) of hardmask material 340 exposed over sacrificial gate material 370 is substantially equal to the footprint of the patterned sacrificial gate stack.

Returning to FIG. 6, at operation 675 the patterned resistor stack is masked off and the sacrificial gate stacks replaced following any known gate replacement process. The resistor mask is then removed and the portion of the resistor hardmask material unprotected by the planarized ILD is etched to recess a portion of the first resistive material. In the exemplary embodiment illustrated in FIG. 7E, a gate dielectric (not shown), gate electrodes 570, and a capping material 575 is backfilled into regions previously occupied by the sacrificial gate stacks. As further illustrated in FIG. 7F, a recess 720 is anisotropically etched into resistive material 315 to expose a surface of the underlying substrate isolation dielectric 106.

Returning to FIG. 6 at operation 685, a second resistive material is backfilled into the recess formed during recess etch operation 680. The second resistive material is planarized with the surrounding ILD and remnants of the hardmask material. In the exemplary embodiment further illustrated in FIG. 7G, resistive material 320 has been backfilled and a top surface planarized with top surfaces of hardmask material 340, ILD 350, dielectric spacers 565, and gate capping material 575.

Figure 7H:
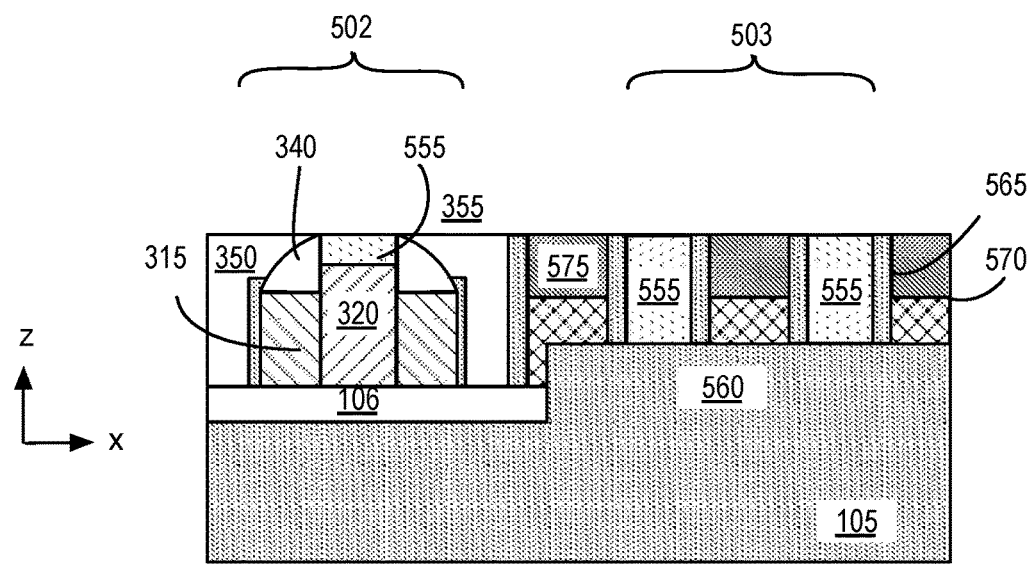

Method 601 (FIG. 6) continues at operation 690 where transistor and resistor contacts are patterned. In some advantageous embodiments, a contact opening mask defining both resistor contacts and one or more transistor contacts is patterned concurrently. Unmasked ILD is then recess etched to expose source/drain regions of the transistor. An unmasked portion of the second resistive material may also be recessed etch. Recess etching of the resistive material may be concurrent with recessing of the ILD. The resistive material may also be recessed etched during separate operation if the ILD recess is sufficiently selective and removes very little of the exposed resistive material. The recesses formed at operation 690 are then backfilled with contact metallization at operation 695 using any known metallization process (e.g., blanket deposition and planarization polish) to arrive at the IC structure substantially as depicted in FIG. 7H. Method 601 (FIG. 6) is then completed at operation 699 where the IC structure is completed with any known backend metallization and ILD processing, for example to interconnect lateral compound resistor 502 with transistor 503.

Figure 8:
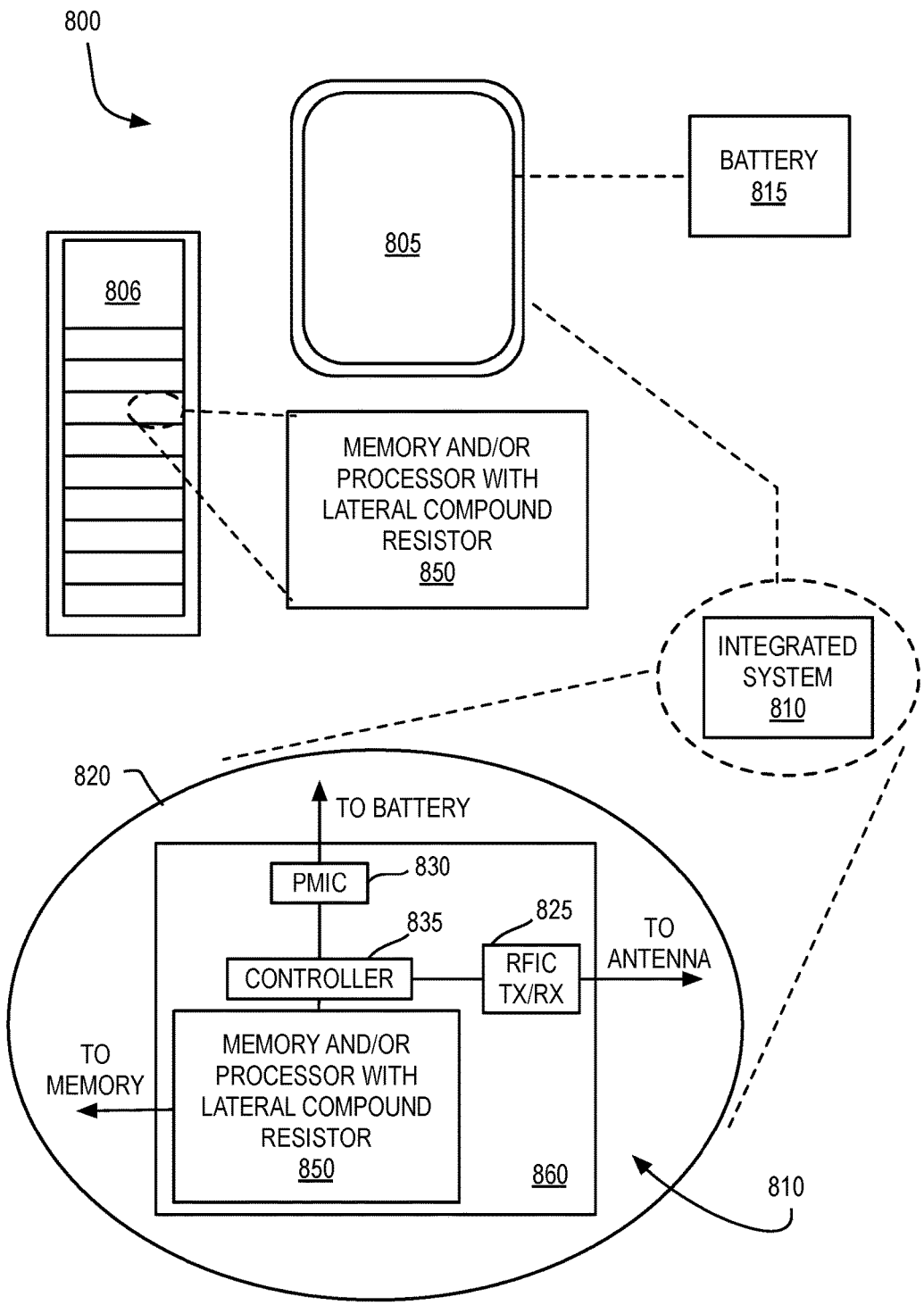
FIG. 8 illustrates a mobile computing platform and a data server machine employing an IC structure including a lateral compound resistor, in accordance with some embodiments.

FIG. 8 illustrates a system 800 in which a mobile computing platform 805 and/or a data server machine 806 employs an IC structure including a lateral compound resistor in accordance with one or more embodiment of the present invention. The server machine 806 may for example include any number of high-performance computing platforms further including a packaged monolithic IC 850 disposed within a rack and networked together for electronic data processing. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Whether disposed within the integrated system 810 illustrated in the expanded view 820, or as a stand-alone packaged chip within the server machine 806, packaged monolithic IC 850 includes a memory chip (e.g., RAM), or a processor chip (e.g., a central microprocessor, graphics processor, or the like) employing a compound lateral resistor, for example as describe elsewhere herein. The monolithic IC 850 may be further coupled to a board, a substrate, or integrated into a system-on-chip (SOC) 860 along with, one or more of a power management integrated circuit (PMIC) 830, RF (wireless) integrated circuit (RFIC) 825 including a wideband RF (wireless) transmitter and/or receiver (TX/RX). The RFIC may include a digital baseband and an analog front end module further comprising a power amplifier on a transmit path and a low noise amplifier on a receive path), and a controller 835. As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

PMIC 830 may perform battery power regulation, DC-to-DC conversion, etc., and so has an input coupled to battery 815 and with an output providing a current supply coupled to other functional modules.

In alternative implementations, each of these board-level modules may be integrated onto separate ICs coupled to the package substrate of the monolithic IC 850 or within a single IC coupled to the package substrate of the monolithic IC 850. In some embodiments, at least one of a processor IC, memory IC, RFIC, or PMIC includes logic circuitry that incorporates a lateral compound resistor, and/or a transistor interconnected to a lateral compound resistor, having one or more of the structural features described elsewhere herein.

Figure 9:
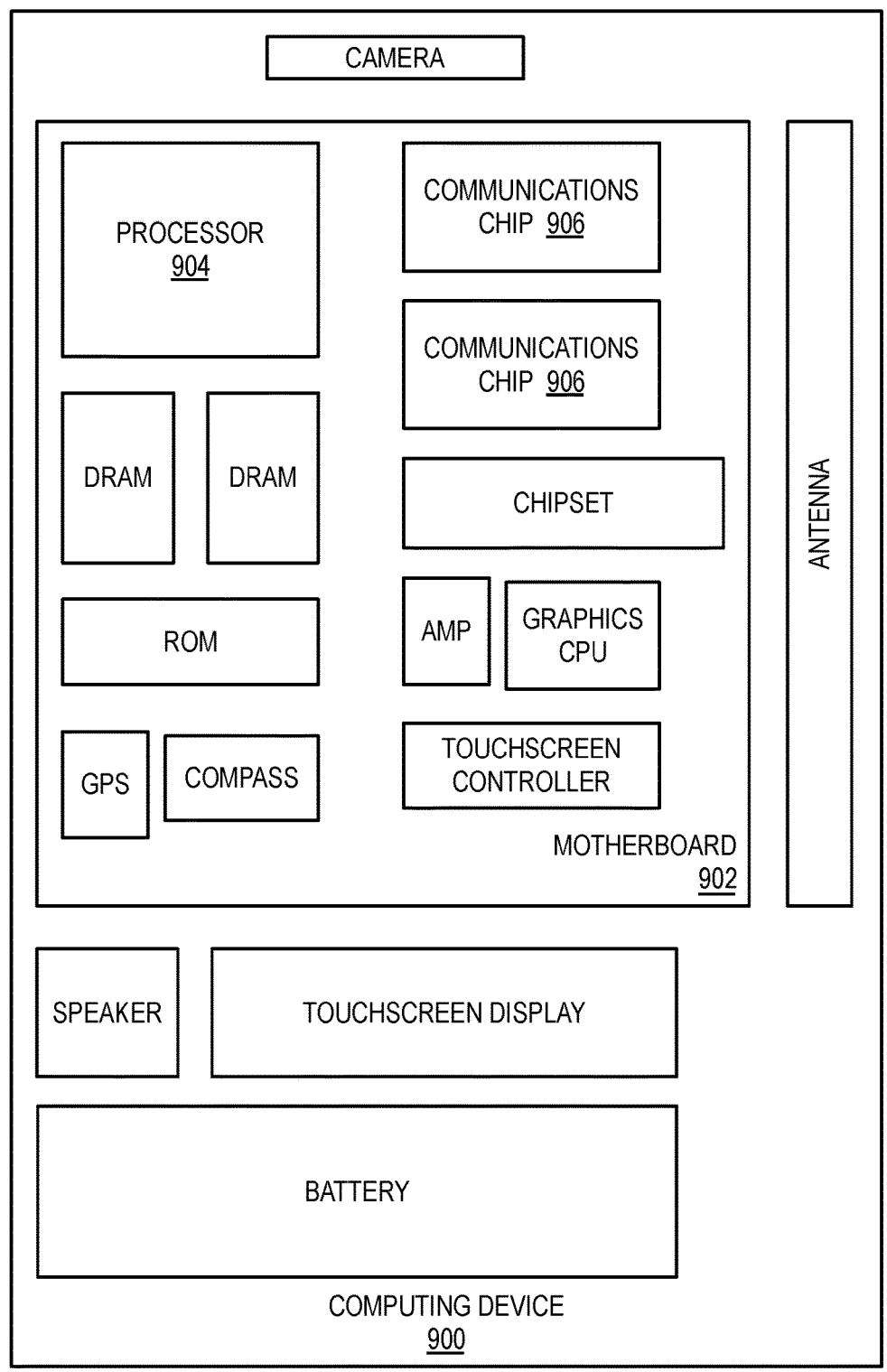
FIG. 9 is a functional block diagram of an electronic computing device, in accordance with some embodiments.

FIG. 9 is a functional block diagram of a computing device 900, arranged in accordance with at least some implementations of the present disclosure. Computing device 900 may be found inside platform 805 or server machine 806, for example. Device 900 further includes a motherboard 902 hosting a number of components, such as, but not limited to, a processor 904 (e.g., an applications processor), which may further incorporate a lateral compound resistor structure, and/or a transistor and a lateral compound resistor structure, in accordance with one or more embodiments of the present invention. Processor 904 may be physically and/or electrically coupled to motherboard 902. In some examples, processor 904 includes an integrated circuit die packaged within the processor 904. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first embodiment, an integrated circuit (IC) structure includes a resistor trace extending laterally over a substrate, a length of the resistor trace comprising a first resistive material in contact with a sidewall of a second resistive material. The structure further includes a first dielectric material disposed over the first resistive material, but not the second resistive material, and a pair of resistor contacts coupled to opposite ends of the trace separated by the length.

In furtherance of the first embodiments, the first resistive material is disposed adjacent to two opposite sidewalls of the second resistive material. The pair of resistor contacts couple to the first resistive material only through second resistive material. The structure further comprises a second dielectric material disposed over an outer sidewall of both the first resistive material and the first dielectric material.

In furtherance of the embodiments immediately above, the IC structure further comprises a third dielectric material disposed over the second resistive material and in contact with a sidewall of the first dielectric material.

In furtherance of the first embodiments, the first and second resistive materials are selected from the group consisting of: polycrystalline semiconductor and metallic compounds.

In furtherance of the embodiments immediately above, the first resistive material is polycrystalline silicon.

In furtherance of the first embodiments, a z-thickness of the second resistive material is greater than that of the first resistive material.

In furtherance of the embodiments immediately above, a z-thickness of the first dielectric material is equal to a difference in z-height between the first and second resistive materials.

In furtherance of the embodiments immediately above, the pair of resistor contacts include a first metallization having a top surface planar with the first dielectric material, and an interconnect metallization disposed on the first metallization.

In furtherance of the embodiments immediately above, the IC structure further comprises a transistor disposed over the substrate and adjacent to the resistor trace. The transistor further comprises a gate stack disposed over a semiconductor channel, the gate stack including a gate electrode disposed over a gate dielectric, a pair of semiconductor source/drains disposed on opposite sides of the semiconductor channel, and a pair of source/drain contacts disposed on the pair of semiconductor source/drains and separated from the gate stack by a spacer dielectric material that is also disposed on a sidewall of the first dielectric.

In furtherance of the embodiments immediately above, the pair of source/drain contacts comprise a first metallization, the pair of resistor contacts comprise the first metallization, and the first metallization has a top surface planar with the first dielectric material.

In furtherance of the embodiments immediately above, the semiconductor channel comprises a semiconductor fin extending a z-height above an isolation dielectric material, the first and second resistive materials are disposed on the isolation dielectric material, and the second resistive material has a greater z-height than does the gate electrode as measured from an interface of the isolation dielectric material and at least one of the resistive materials.

In one or more second embodiments, a method of fabricating an integrated circuit (IC) structure, includes forming a trace of first resistive material extending laterally over a substrate, removing a portion of the first resistive material along a longitudinal centerline of the trace, backfilling a void within the first resistive material trace with a second resistive material, and forming a pair of resistor contacts landing on at least one of the first and second resistive materials.

In furtherance of the embodiments immediately above, forming the trace of first resistive material comprises depositing a resistor stack including a resistor hardmask disposed over the first resistive material. Removing the portion of the first resistive material along a longitudinal centerline of the trace further comprises forming a resistor mask with rounded sidewall shoulders, etching the resistor stack and translating the rounded sidewall shoulders into the resistor hardmask, removing the resistor mask, forming an interlayer dielectric (ILD) material planarized around the resistor hardmask, etching an exposed portion of the resistor hardmask to expose a portion of the first resistive material, and etching the exposed portion of the first resistive material.

In furtherance of the second embodiments, forming the pair of resistor contacts further comprises forming a contact mask over the second resistive material, recessing a portion of the second resistive material unprotected by the contact mask, removing the contact mask, depositing a first metallization, and planarizing the first metallization with the ILD material and the resistor hardmask.

In furtherance of the embodiments immediately above, the method further comprises forming a transistor over the substrate adjacent to the resistive trace. Forming the transistor further comprises forming a semiconductor channel region, forming a gate stack disposed over the semiconductor channel, the gate stack including a gate electrode disposed over a gate dielectric, forming a pair of semiconductor source/drains disposed on opposite sides of the semiconductor channel, and forming a pair of source/drain contacts disposed on the pair of semiconductor source/drains. Forming the pair of source/drain contacts further comprises depositing the first metallization onto the semiconductor source/drains concurrently with depositing the first metallization onto the second resistive material.

In furtherance of the second embodiments, the method further comprises forming a transistor over the substrate adjacent to the resistive trace. Forming the transistor further comprises forming a semiconductor channel region, forming a gate stack disposed over the semiconductor channel, the gate stack including a gate electrode disposed over a gate dielectric. Forming the gate stack further comprises depositing the first resistive material over the semiconductor channel, patterning the first resistive material disposed over the semiconductor channel into a sacrificial gate electrode, forming the ILD around the sacrificial gate electrode, and replacing the sacrificial gate electrode with the gate electrode.

In furtherance of the second embodiments, depositing the first resistive film or backfilling the void with the second resistive film further comprises depositing a polycrystalline semiconductor material.

In one or more third embodiments, a system on a chip (SOC), comprises processor logic circuitry, memory circuitry coupled to the processor logic circuitry, RF circuitry coupled to the processor logic circuitry and including radio transmission circuitry and radio receiver circuitry, power management circuitry including an input to receive a DC power supply and an output coupled to at least one of the processor logic circuitry, memory circuitry, and RF circuitry. At least one of the processor logic circuitry, memory circuitry, RF circuitry, or power management circuitry include both transistor and a resistor trace extending laterally over a substrate, a length of the resistor trace comprising a first resistive material in contact with a sidewall of a second resistive material, a first dielectric material disposed over the first resistive material, but not the second resistive material, and a pair of resistor contacts coupled to opposite ends of the trace. The transistor further comprises a gate stack disposed over a semiconductor channel, the gate stack including a gate electrode disposed over a gate dielectric, a pair of semiconductor source/drains disposed on opposite sides of the semiconductor channel, and source/drain contacts disposed on the pair of semiconductor source/drains and separated from the gate stack by a spacer dielectric material that is also disposed on a sidewall of the first dielectric.

In furtherance of the third embodiments, the first resistive material is disposed on two opposite sidewalls of the second resistive material, the source/drain contacts comprise a first metallization, the pair of resistor contacts comprise the first metallization, and the first metallization has a top surface planar with the first dielectric material. In furtherance of the embodiments immediately above, the semiconductor channel comprises a semiconductor fin extending a z-height above an isolation dielectric material. The first and second resistive materials are disposed on the isolation dielectric material. The second metallization has a greater z-height than does the gate electrode as measured from an interface of the isolation dielectric material and the resistive materials.

In one or more third embodiments, a system on a chip (SOC), comprises processor logic circuitry, memory circuitry coupled to the processor logic circuitry, RF circuitry coupled to the processor logic circuitry and including radio transmission circuitry and radio receiver circuitry, and power management circuitry including an input to receive a DC power supply and an output coupled to at least one of the processor logic circuitry, memory circuitry, and RF circuitry. At least one of the processor logic circuitry, memory circuitry, RF circuitry, or power management circuitry include the integrated circuit (IC) structure of any one of the first embodiments.

In one or more third embodiments, the IC structure of any of the first embodiments further includes a transistor disposed over the substrate and adjacent to the resistive trace, the transistor further comprising a gate stack disposed over a semiconductor channel, the gate stack including a gate electrode disposed over a gate dielectric, a pair of semiconductor source/drains disposed on opposite sides of the semiconductor channel, and a pair of source/drain contacts disposed on the pair of semiconductor source/drains and separated from the gate stack by a spacer dielectric material that is also disposed on a sidewall of the first dielectric.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. An integrated circuit (IC) structure, comprising:
   a resistor trace over a substrate, a length of the resistor trace comprising a first resistive material in contact a sidewall of a second resistive material;
   a first dielectric material over the first resistive material, but not over the second resistive material; and
   a pair of resistor contacts coupled to opposite ends of the resistor trace and separated by the length.
2. The IC structure of claim 1, wherein:
   the first resistive material is adjacent to two opposite sidewalls of the second resistive material;
   the pair of resistor contacts couple to the first resistive material through the second resistive material; and
   the structure further comprises a second dielectric material over an outer sidewall of both the first resistive material and the first dielectric material.
3. The IC structure of claim 2, further comprising:
   a third dielectric material over the second resistive material and in contact with a sidewall of the first dielectric material.
4. The IC structure of claim 1, wherein:
   the first and second resistive materials comprise at least one of: polycrystalline semiconductor and metallic compounds.
5. The IC structure of claim 4, wherein the first resistive material is polycrystalline silicon.
6. The IC structure of claim 1, wherein:
   a z-thickness of the second resistive material is greater than that of the first resistive material.
7. The IC structure of claim 6, wherein a z-thickness of the first dielectric material is equal to a difference in z-height between the first and second resistive materials.
8. The IC structure of claim 1, wherein
   the pair of resistor contacts includes a first metallization having a top surface planar with the first dielectric material, and an interconnect metallization on the first metallization.
9. The IC structure of claim 1, further comprising a transistor over the substrate and adjacent to the resistor trace, the transistor further comprising:
   a gate stack over a semiconductor body, the gate stack including a gate electrode over a gate dielectric;
   a semiconductor source and drain coupled to the semiconductor body on opposite sides of the gate stack; and
   a source and drain contact on the semiconductor source and drain, and separated from the gate stack by a dielectric material that is also on a sidewall of the first dielectric material.
10. The IC structure of claim 9, wherein:
    the source and drain contacts comprise a first metallization;
    the pair of resistor contacts comprise the first metallization; and
    the first metallization has a top surface planar with the first dielectric material.
11. The IC structure of claim 9, wherein:
    the semiconductor comprises a semiconductor fin extending a z-height above an isolation dielectric material;
    the first and second resistive materials are on the isolation dielectric material;
    the second resistive material has a greater z-height than the gate electrode as measured from an interface of the isolation dielectric material and at least one of the resistive materials.
12. A method of fabricating an integrated circuit (IC) structure, the method comprising:
   forming a trace of first resistive material extending laterally over a substrate;

removing a portion of the first resistive material along a longitudinal centerline of the trace;
backfilling a void within the first resistive material trace with a second resistive material; and
forming a pair of resistor contacts landing on at least one of the first and second resistive materials.

13. The method of claim 12, wherein:
forming the trace of first resistive material comprises depositing a resistor stack over the first resistive material, wherein the resistor stack comprises a resistor hardmask; and
removing the portion of the first resistive material along a longitudinal centerline of the trace further comprises:
forming a resistor mask with sidewall shoulders;
etching the resistor stack and translating the sidewall shoulders into the resistor hardmask;
removing the resistor mask;
forming a dielectric material planarized around the resistor hardmask;
exposing a portion of the first resistive material by etching an exposed portion of the resistor hardmask; and
etching the exposed portion of the first resistive material.

14. The method of claim 12, wherein forming the pair of resistor contacts further comprises:
forming a contact mask over the second resistive material;
recessing a portion of the second resistive material unprotected by the contact mask;
removing the contact mask;
depositing a first metallization; and
planarizing the first metallization with the dielectric material and the resistor hardmask.

15. The method of claim 14, further comprising forming a transistor over the substrate adjacent to the resistive trace, wherein forming the transistor further comprises:
forming a gate stack over a semiconductor body, the gate stack including a gate electrode over a gate dielectric;
forming a semiconductor source and drain on opposite sides of the gate stack; and
forming a source and drain contact on the semiconductor source and drain, wherein forming the source and drain contacts further comprises:
depositing the first metallization onto the semiconductor source and drain concurrently with depositing the first metallization onto the second resistive material.

16. The method of claim 13, further comprising forming a transistor over the substrate adjacent to the resistive trace, wherein forming the transistor further comprises:
forming a gate stack over a semiconductor body, the gate stack including a gate electrode disposed over a gate dielectric, wherein forming the gate stack further comprises:
depositing the first resistive material over the semiconductor body;
patterning the first resistive material into a sacrificial gate electrode;
forming the ILD around the sacrificial gate electrode; and
replacing the sacrificial gate electrode with the gate electrode.

17. A system on a chip (SOC), comprising:
processor logic circuitry;
memory circuitry coupled to the processor logic circuitry;
RF circuitry coupled to the processor logic circuitry and including radio transmission circuitry and radio receiver circuitry; and
power management circuitry including an input to receive a DC power supply and an output coupled to at least one of the processor logic circuitry, memory circuitry, and RF circuitry, wherein at least one of the processor logic circuitry, memory circuitry, RF circuitry, or power management circuitry include both:
a resistor trace over a substrate, a length of the resistor trace comprising a first resistive material in contact a sidewall of a second resistive material;
a first dielectric material over the first resistive material, but not the second resistive material; and
a pair of resistor contacts coupled to opposite ends of the resistive trace and separated by the length; and
a transistor further comprising:
a gate stack over a semiconductor body, the gate stack including a gate electrode over a gate dielectric;
a semiconductor source and drain on opposite sides of the gate stack; and
source and drain contacts on the semiconductor source and drain, and separated from the gate stack by a spacer dielectric material that is also on a sidewall of the first dielectric.

18. The SOC of claim 17, wherein:
the first resistive material comprises a perimeter surrounding the second resistive material;
the source and drain contacts comprise a first metallization;
the resistor contacts comprise the first metallization; and
the first metallization has a top surface planar with the first dielectric material.

19. The SOC of claim 18, wherein:
the first resistive material comprises a perimeter surrounding the second resistive material;
the source and drain contacts comprise a first metallization;
the resistor contacts comprise the first metallization; and
the first metallization has a top surface planar with the first dielectric material.

20. The SOC of claim 19, wherein the semiconductor body comprises a semiconductor fin extending a z-height above an isolation dielectric material;
the first and second resistive materials are on the isolation dielectric material;
the second metallization has a greater z-height than the gate electrode as measured from an interface of the isolation dielectric material and the resistive materials.

* * * * *